United States Patent
Sindalovsky

(10) Patent No.: US 6,404,840 B1
(45) Date of Patent: Jun. 11, 2002

(54) VARIABLE FREQUENCY DIVIDER

(75) Inventor: Vladimir Sindalovsky, Perkasie, PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/888,814

(22) Filed: Jun. 25, 2001

(51) Int. Cl.[7] ............................................. H03K 21/00
(52) U.S. Cl. ........................ 377/48; 327/115; 327/175; 327/299
(58) Field of Search ........................... 377/48; 327/299, 327/175, 115

(56) References Cited

U.S. PATENT DOCUMENTS

| | | | | |
|---|---|---|---|---|
| 5,617,458 A | * | 4/1997 | Jones et al. | 377/49 |
| 5,748,949 A | * | 5/1998 | Johnston | 395/557 |
| 6,121,801 A | * | 9/2000 | Lee | 327/115 |

* cited by examiner

Primary Examiner—Margaret R. Wambach
(74) Attorney, Agent, or Firm—Synnestvedt & Lechner LLP

(57) ABSTRACT

A frequency divider and method for dividing a clock signal. The frequency divider including a first configurable signal generator, a second configurable signal generator, a data source coupled to the signal generators providing configuration data based on instructions received at an instruction port, a sequencer generating the instructions coupled between the signal generators and the data source and passing the instructions to the instruction port of the data source, and combining logic coupled to the outputs of the signal generators to produce the reduced frequency signal. The method including generating a first signal having first and second counting intervals which are individually configurable and based on a rising edge of the clock signal, generating a second signal having third and fourth counting intervals which are individually configurable and based on a falling edge of the clock signal, and combining the signals to create the reduced frequency signal, wherein the output level of the reduced frequency signal changes after every counting interval.

25 Claims, 3 Drawing Sheets

VARIABLE FREQUENCY DIVIDER

FIELD OF THE INVENTION

The present invention relates to frequency dividers and, more particularly, to variable frequency dividers for dividing clock frequency signals to obtain lower frequency signals.

BACKGROUND OF THE INVENTION

Clock signals are used in electronic systems to synchronize processing between electronic components within the systems. The clock signals are typically generated by or based on a relatively high frequency clock signal produced by a system clock. Frequently, components within the system require clock signals having a lower frequency than the high frequency clock signal. Frequency dividers are used to reduce the high frequency clock signal to lower frequency signals required by these components.

Conventionally, counter based frequency dividers which generate a pulse after each counting period are used to divide a high frequency clock signal by an integer value. These counters are "OR"ed together to produce rational rate multipliers (RRM) capable of dividing high frequency clock signals by rational numbers, e.g., frequency division by three-fifths (3/5) or other rational numbers. The RRMs produce a series of pulses which are capable of non-integer frequency division on average, however, their momentary frequency varies over time and their duty cycles may be uneven, i.e., other that 50%. A changing momentary frequency is when the period of a signal changes between pulses and an uneven duty cycle is when the duration of a clock pulse is more or less than half the clock's period. Due to the sensitivity of some system components, a constant momentary frequency with a near 50% duty cycle is desirable.

FIG. 1 depicts illustratively a clock signal 10 and a non-uniform divided clock signal 12 produced from the clock signal 10 by a frequency divider such as an RRM. An RRM used to produce the divided clock signal 12 in the present illustration utilizes three counters "OR"ed together in a conventional manner. The RRM operates by loading each of the counters with an appropriate counting period and delay. The counting period determines the distance between pulses for each individual counter and the delay spreads out the pulses of the counters when combined. For example, if the RRM was to divide the clock signal 10 by 3/5, three counters could be employed to generate three pulses 16, 18, and 20 spread over a period of five clock cycles 14. In this example, each counter is configured to count for five cycles and produce a pulse. In addition, upon initialization, the first counter produces the first pulse 16 with no delay, the second counter produces the second pulse 18 after a one clock cycle, and the third counter produces the third pulse 20 after a three clock cycle delay. In this manner, the RRM will produce 3 pulses every five clock cycles 14 with the pulses spread over the five clock cycles 14 and, therefore, will divide the clock signal 10 by 3/5.

As depicted in FIG. 1, although the average frequency of the divided clock 12 is 3/5 the frequency of the clock signal 10, the momentary frequency of the divided clock 12 varies over time. For example, the period 22 containing the first pulse 16 is the same as the period of the clock signal 10 and, therefore, the divided signal will have the same momentary frequency as the frequency of the clock signal 10. However, periods 24 and 26 containing the first and second pulses 18 and 20 are twice the period of the clock signal 10 and, therefore, will have a momentary frequency which is half the frequency of the clock signal 10. In addition, the duty cycle of the divided clock signal 12 varies between approximately 50% for the first pulse 16 (see pulse width 28 versus period 22) and approximately 25% for the second pulse 18 (see pulse width 30 versus period 24). The varying momentary frequency and uneven duty cycle is a result of using pulses which are produced by the counters in the RRM as the pulses 16, 18, and 20 of the divided clock 12. Since the width of the pulses 16, 18, and 20 and the distance between them would have to change as the divisor of the RRM changes, it is difficult to maintain a constant momentary frequency and even duty cycle. This is due to inherent difficulties in changing the duration of the individual pulses produced by a counter and spreading the pulses over a specified period, e.g., the period of five clock cycles 14.

Since, as mentioned above, it is desirable to divide high frequency clock signals to obtain a specific, uniform lower frequency signal, and this is hindered by the capabilities of present frequency dividers which are capable generally of dividing by integers only or producing a signal having a momentary frequency or duty cycle which varies over time, there is a need in the industry for a stable, variable frequency divider able to divide high frequency clock signals with more precision than traditional integer based dividers. The present invention fulfills this need among others.

SUMMARY OF THE INVENTION

The present invention provides for a frequency divider and method for dividing a clock signal which overcome the aforementioned problems by producing an output which is based on counting intervals. In doing so, the present invention is able to divide an input frequency by multiples of half an integer with a constant momentary frequency while maintaining a duty cycle of approximately 50%.

One aspect of the present invention is a frequency divider for dividing a clock signal to produce a reduced frequency output signal. In a preferred embodiment, the frequency divider comprises a first configurable signal generator having an input for receiving the clock signal, a second configurable signal generator having an input for receiving the clock signal, a data source coupled to the signal generators making configuration data available to the first and second configurable signal generators based on instructions received at an instruction port, a sequencer generating the instructions based on outputs of the first and second configurable signal generators coupled between the first and second signal generators and the data source, and combining logic coupled to the outputs of the signal generators producing the reduced frequency signal.

Another aspect of the invention is a method for dividing a clock signal. In a preferred embodiment, the method divides a clock signal to generate a reduced frequency signal by generating a first signal comprising first and second counting intervals which are individually configurable and based on a rising edge of the clock signal, generating a second signal comprising third and fourth counting intervals which are individually configurable and based on a falling edge of the clock signal, and combining the signals to create the reduced frequency signal, wherein the output level of the reduced frequency signal changes after every counting interval.

DETAILED DESCRIPTION OF THE INVENTION

Figure 1:
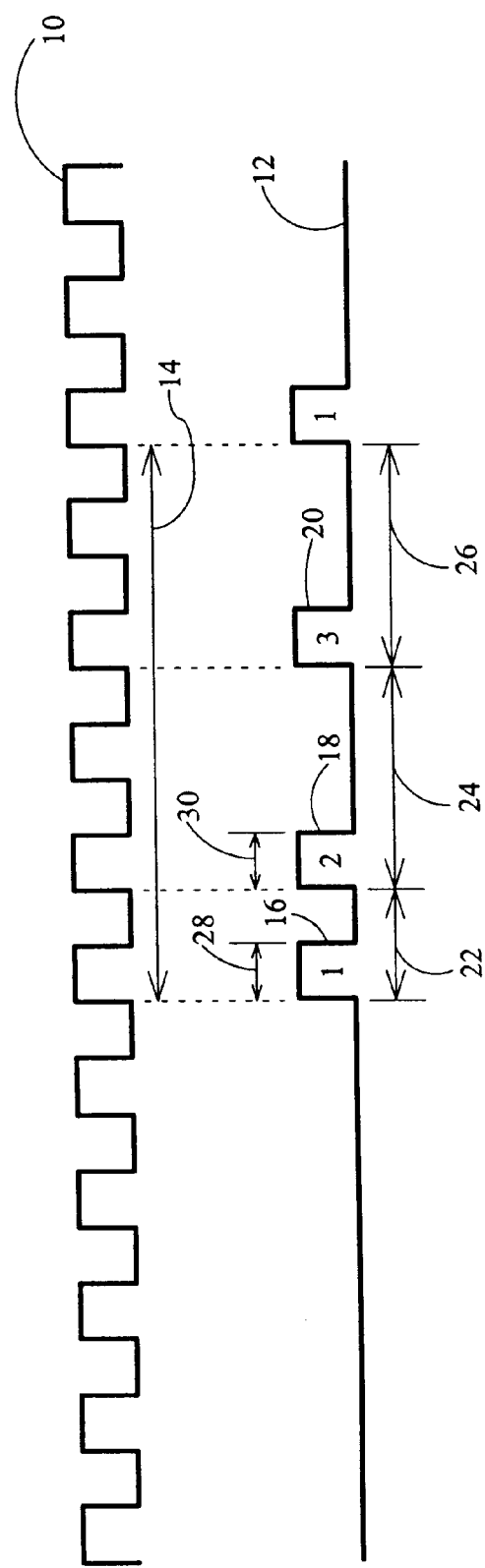
FIG. 1 is a timing diagram of a clock signal and divided clock signal produced by a prior art frequency divider.
Figure 2:
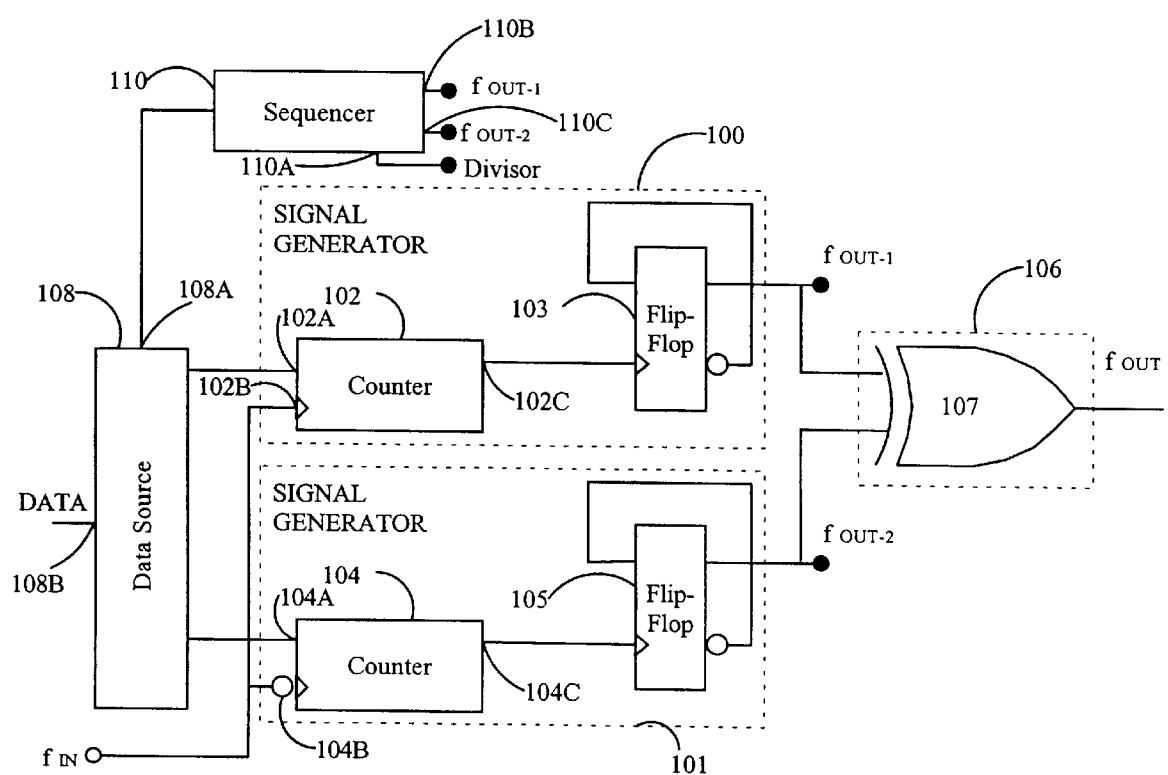
FIG. 2 is a block diagram of a variable frequency divider in accordance with the present invention.

FIG. 2 depicts a preferred embodiment of a variable frequency divider in accordance with the present invention. In general, the variable frequency divider includes a first signal generator 100, a second signal generator 101, a combiner 106, a data source 108, and a sequencer 110. The variable frequency divider of FIG. 2 is capable of dividing an input frequency, $f_{IN}$, by multiples of half an integer (e.g., 1.5, 2.0, 2.5) to obtain an output frequency, $f_{OUT}$, which has a constant momentary frequency and a duty cycle of approximately 50%. The variable frequency divider of FIG. 2 will be described in more detail below.

The first signal generator 100 is a configurable signal generator used to generate an intermediate output $f_{OUT-1}$. In the preferred embodiment, the signal generator 100 includes a conventional counter 102 and a flip-flop 103. The counter 102 is preferably a countdown counter. The counter 102 contains a configuration port 102A for receiving data, e.g., an integer value, which can be used to configure the counter 102 (and, thereby, the signal generator 100). In addition, the counter 102 contains an input port 102B (e.g., a clock port) through which the input frequency $f_{IN}$ is received. The counter 102 generates a pulse at an output port 102C and loads data available at the configuration port 102A when the counter 102 counts a number of clock cycles equal to the integer value entered into the counter 102. The flip-flop 103 is used to convert the pulse at the output port 102C into a sustained level change at an intermediate output $f_{OUT-1}$. The output level of the intermediate output $f_{OUT-1}$ will remain unchanged until the next pulse is generated by the counter 102.

The second signal generator 101 is another configurable signal generator essentially identical to the signal generator 100 except, as discussed below, the clock edges on which the counters 102 and 104 trigger are reversed. The second signal generator 101 generates an intermediate output $f_{OUT-2}$. In the preferred embodiment, the signal generator 101 includes a conventional counter 104 and a flip-flop 105. The counter 104 is preferably a countdown counter. The counter 104 contains a configuration port 104A for receiving data, e.g., an integer value, which can configure the counter 104 (and, thereby, the second signal generator 101). In addition, the counter 104 contains an input port 104B (e.g., a clock port) through which the input frequency $f_{IN}$ is received. The counter 104 generates a pulse at an output port 104C and loads data available at the configuration port 104A when the counter 104 counts a number of clock cycles equal to the integer value entered into the counter 104. The flip-flop 105 converts the pulse at the output port 104C into a sustained level change at the intermediate output $f_{OUT-1}$.

In the illustrated embodiment, the first signal generator 100 is rising edge triggered and the second signal generator 101 is falling edge triggered. By triggering the signal generators 100 and 101 on opposite edges of the input frequency $f_{IN}$, the frequency divider of FIG. 2 is capable of dividing the input frequency $f_{IN}$ by multiples of half an integer. In addition, in the illustrated embodiment, the counters 102 and 104 take a clock cycle to load, therefore, to make a level change which lasts for a certain number of clock cycles, the counters 102 and 104 are loaded with an integer value which is one less than the desired number of clock cycles. For example, if a level of an intermediate clock signal $f_{OUT-1}$ or $f_{OUT-2}$ is to last for three (3) clock cycles, the corresponding counter 102 or 104 will be loaded with a two (2).

The combiner 106 combines the intermediate outputs $f_{OUT-1}$ and $f_{OUT-2}$ to create the output frequency $f_{OUT}$. Preferably, the combiner 106 is an exclusive OR gate (XOR) 107. By using an XOR gate 107 the output signal $f_{OUT}$ will change levels at every level change of the intermediate outputs $f_{OUT-1}$ and $f_{OUT-2}$. It should be noted that level changes of $f_{OUT-1}$ and $f_{OUT-2}$ occur in response to pulses generated by the counters 102 and 104 and that the pulses are generated in response to a specific number of rising/falling edges of the input signal $f_{IN}$. Therefore, level changes will correspond to rising/falling edges of the input signal $f_{IN}$. This arrangement allows the output frequency $f_{OUT}$ to be based on events in time which correspond to the input frequency $f_{IN}$ rather than the duration of individual pulses and the spreading of those individual pulses as in prior art systems. Alternative combiners 106 for use with the present invention will be apparent to those skilled in the art.

The data source 108 houses configuration data for configuring the counters 102 and 104. The data source 108 makes configuration data available to the counters 102 and 104 which is based on instruction received at an instruction port 108A of the data source 108. In a preferred embodiment, the data source 108 houses two integer values and, if needed, a delay value for each counter 102 and 104. The values are loaded into the data source 108 via a data port 108B. In the preferred embodiment, the data source 108 is a conventional memory circuit which is, preferably, a known dual port memory circuit. In embodiments where the data source 108 is a conventional memory circuit, the data for configuring the counters 102 and 104 is made available by supplying an instruction including the address of the appropriate configuration data within the memory via the instruction port 108A.

In an alternative embodiment, the data source 108 houses two integer values and, if needed, a delay value for each counter 102 and 104 for every "divisor" by which the frequency divider of FIG. 2 will divide the input frequency $f_{IN}$. The configuration data for each divisor are stored in a table within the data source 108, and the configuration data for a particular divisor are accessed by supplying an instruction including the address of the appropriate configuration data within the table via the instruction port 108A. In yet another embodiment, the data source is combinational logic that acts as a decoder which produces the configuration data based on signals received from the sequencer 110. Suitable data sources 108 for use in the present invention will be apparent to those skilled in the art.

The sequencer 110 generates the instructions for the data source 108. In the preferred embodiment, the sequencer 110 generates instructions for the data source 108 based on the intermediate output signal $f_{OUT-1}$ at an intermediate input port 110B and the intermediate output signal $f_{OUT-2}$ at intermediate input port 110C. In embodiments where the data source 108 houses configuration data for multiple divisor values, the sequencer 110 generates instructions for the data source 108 further based on divisor information received at a divisor port 110A. In embodiments where data source 108 is a conventional memory circuit, the instructions convey information for instructing the memory circuit to make configuration data located at a particular memory address available to the first and second signal generators 100 and 101.

The sequencer 110 passes the instructions to the instruction port 108A of the data source 108 which instructs the data source 108 to make a certain value (e.g., integer) available to the first signal generator 100 when $f_{OUT-1}$ is at one level for a particular divisor, and another value when $f_{OUT-1}$ is at another level. Likewise, the sequencer 110 instructs the data source 108 to make a certain value available for the second signal generator 101 when $f_{OUT-2}$ is at one level for the particular divisor, and another value when $f_{OUT-2}$ is at another level.

The sequencer may, if needed, generate instructions conveying information for instructing the data source 108 to make a delay value available to one or both of the signal generators 100 and 101 when the system is initialized. In the preferred embodiment, after initialization, the function of the sequencer 110 is to instruct the data source 108 to make configuration data available to the signal generators 100 and 101 so that the signal generators 100 and 101 can be configured such that the intermediate outputs $f_{OUT-1}$ and $f_{OUT-2}$ each alternate between being at one value for a certain period of time and being at another value for a certain period of time, where the periods of time correspond to the data used to configure the signal generators 100 and 101. A suitable sequencer 110 for use in the present invention will be apparent to those skilled in the art.

Figure 3:
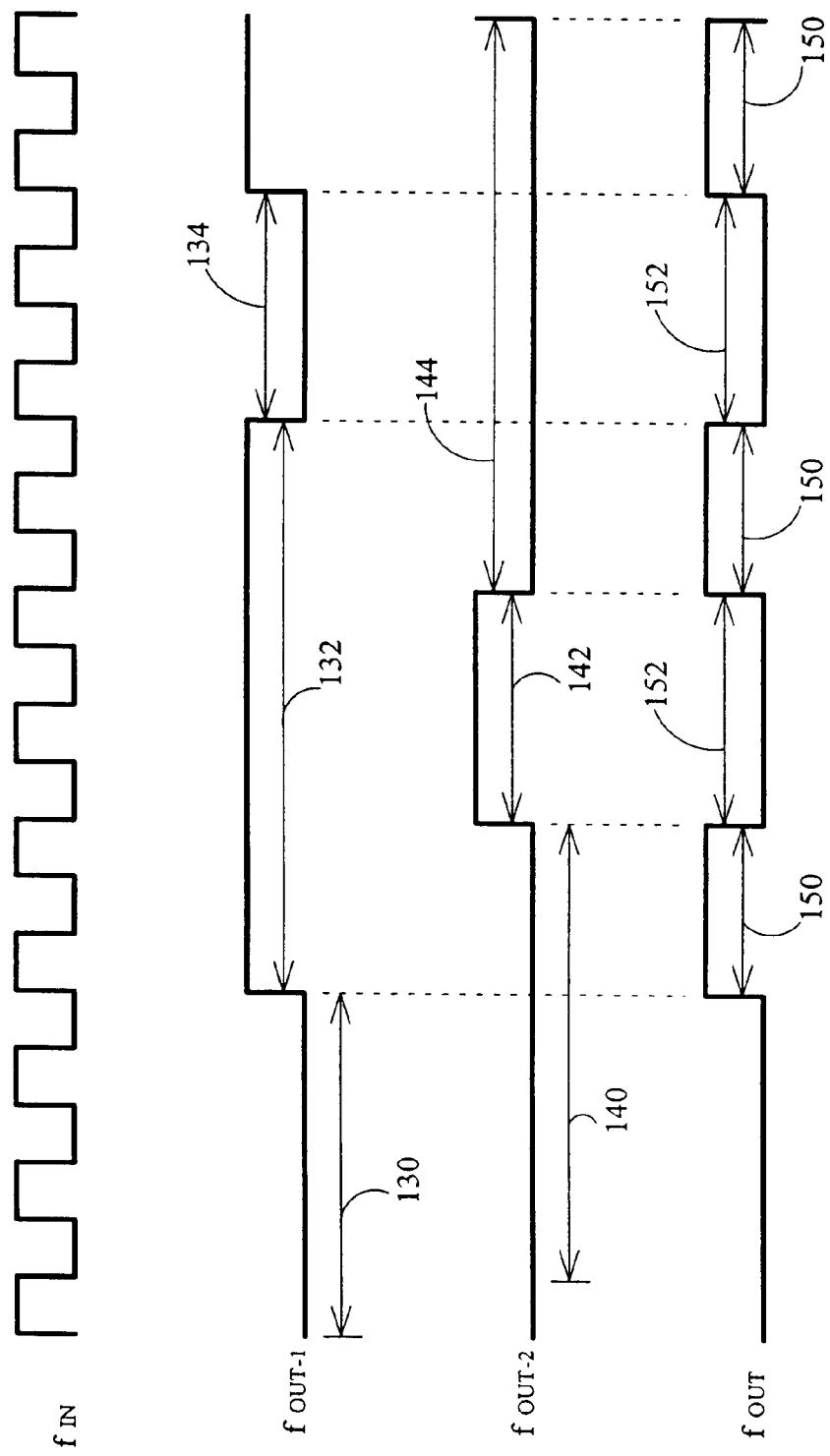
FIG. 3 is a timing diagram for the variable frequency divider depicted in FIG. 2 configured to divide an input frequency by 3.5 to produce a divided output frequency.

FIG. 3 depicts a timing diagram illustrating the operation of the variable frequency divider of FIG. 2 configured for dividing an input frequency $f_{IN}$ by 3.5 to create a divided output frequency $f_{OUT}$. Upon initialization, the intermediate outputs $f_{OUT-1}$ and $f_{OUT-2}$ are set low. In addition, upon initialization, if needed, the sequencer 110 passes instructions to the data source 108 which instruct the data source 108 to make delay integers available to one or both of the counters 102 and 104. Since the counters 102 and 104 take one clock cycle to load, the delay integers are one less than the number of clock signals required to produce the desired delay. During the delay, the intermediate outputs $f_{OUT-1}$ and $f_{OUT-2}$ remain low and, thereafter, alternate between a high value and a low value, with the duration of the high and low values dependent on the integers made available by the data source 108.

To produce the first intermediate output $f_{OUT-1}$ in this illustrative example, upon initialization, the data source 108 makes a two (2) available to the first counter 102 to produce a delay count, thereby creating a three clock cycle delay interval 130, and the intermediate output $f_{OUT-1}$ produced by the flip-flop 103 is set low. The intermediate output $f_{OUT-1}$ remains low during the delay interval 130. The sequencer 110, sensing a low value at $f_{OUT-1}$, passes an instruction to the data source 108 through its instruction port 108A to make available a first integer for producing a first counting interval 132. Since the first counter 102 is rising edge triggered, the intermediate output $f_{OUT-1}$ transitions at rising edges of the input frequency $f_{IN}$.

In the illustrated embodiment, the desired number of clock cycles for the first counting interval 132 is five (5), therefore, the data source 108 makes a four (4) available to the counter 102 to produce a first count. After the counter 102 completes the delay count, the counter 102 produces a pulse and loads the new value available at the data source 108 (i.e., the number of clock cycles for the first count). The pulse causes the flip-flop 103 to change the level of the intermediate output $f_{OUT-1}$, thereby causing it to go high. The intermediate output $f_{OUT-1}$ remains high until the next pulse is received after the counter 102 has completed the first count.

When the sequencer 110 senses a high value at the intermediate output $f_{OUT-1}$, the sequencer 110 sends an instruction to the data source 108 to make a second integer value available to the counter 102 for producing a second counting interval 134. In the illustrated embodiment, the desired number of clock cycles for the second counting interval 134 is two (2), therefore, the data source 108 makes a one (1) available to the counter 102 to produce a second count.

After the counter 102 completes the first count, the counter 102 produces a pulse and loads the new value available at the data source 108 (i.e., the number of clock cycles for the second count). The pulse causes the flip-flop 103 to change the level of the intermediate output $f_{OUT-1}$, thereby causing it to go low. The intermediate output $f_{OUT-1}$ remains low until the next pulse is received after the counter 102 has completed the second count. This process is repeated such that the intermediate output $f_{OUT-1}$ alternates between a high value for the five clock cycles of the first counting interval 132 and a low value for the two clock cycles of the second counting interval 134.

To generate the second intermediate output $f_{OUT-2}$, upon initialization, the data source 108 makes a three (3) available to the second counter 104 to produce a delay count, thereby creating a four clock cycle delay interval 140, and the intermediate output $f_{OUT-2}$ produced by the flip-flop 105 is set low. The intermediate output $f_{OUT-2}$ remains low during the delay interval 140. The sequencer 110, sensing a low value at $f_{OUT-2}$, sends an instruction to the data source 108 through its instruction port 108A to make available a first integer for producing a first counting interval 142. Since the second counter 104 is falling edge triggered, the intermediate output $f_{OUT-2}$ transitions at falling edges of the input frequency $f_{IN}$.

In the illustrated embodiment, the desired number of clock cycles for the first counting interval 142 is two (2), therefore, the data source 108 makes a one (1) available to the counter 104 to produce a first count. After the counter 104 completes the delay count, the counter 104 produces a pulse and loads the new value available at the data source 108 (i.e., the number of clock cycles for the first count). The pulse causes the flip-flop 105 to change the level of the intermediate output $f_{OUT-2}$, thereby causing it to go high. The intermediate output $f_{OUT-2}$ remains high until the next pulse is received after the counter 104 has completed the first count.

When the sequencer 110 senses a high value at the intermediate output $f_{OUT-2}$, the sequencer 110 sends an instruction to the data source 108 to make a second integer value available to the counter 104 for producing a second counting interval 144. In the illustrated embodiment, the desired number of clock cycles for the second counting interval 144 is five (5), therefore, the data source 108 will makes a four (4) available to the counter 104 to produce a second count.

After the counter 104 completes the first count, the counter 104 produces a pulse and loads the new value available at the data source 108 (i.e., the number of clock cycles for the second count). The pulse causes the flip-flop 105 to change the level of the intermediate output $f_{OUT-2}$, thereby causing it to go low. The intermediate output $f_{OUT-2}$ remains low until the next pulse is received after the counter 104 has completed the second count. This process is repeated such that the intermediate output $f_{OUT-2}$ alternates between a high value for the two clock cycles of the first counting interval 142 and a low value for the five clock cycles of the second counting interval 144.

The intermediate outputs $f_{OUT-1}$ and $f_{OUT-2}$ are combined by an exclusive OR (XOR) gate 107 to create the output frequency $f_{OUT}$. The level of the output frequency $f_{OUT}$ will change at every level change of the intermediate outputs $f_{OUT-1}$ and $f_{OUT-2}$. In this manner an output frequency $f_{OUT}$ can be generated from an input signal $f_{IN}$ which divides the input frequency $f_{IN}$ by 3.5 (i.e., for every 3.5 clock cycles of the input frequency $f_{IN}$, one clock cycle will be produced at the output frequency $f_{OUT}$. In the illustrative example, the output frequency $f_{OUT}$ will alternate between a high value for a first interval 150 of one and a half clock cycles and a low value for a second interval 152 of two clock cycles. This arrangement produces an output frequency $f_{OUT}$ having a constant momentary frequency with a duty cycle of approximately 50%, i.e., 43%.

It will be apparent to those skilled in the art that the present invention can be configured to divide the input frequency $f_{IN}$ by many different values while maintaining a constant momentary frequency and a duty cycle of approximately 50%. Also, it will be apparent to those skilled in the art that certain divisor values can be obtained by holding the output of one signal generator constant, e.g., the signal generator 101, so that the output frequency $f_{OUT}$ will mirror the intermediate output $f_{OUT-1}$ of the other signal generator, e.g., signal generator 100. In addition, although the illustrated embodiment of FIG. 2 is preferred, it is contemplated that more than two signal generators 102 and 104 could be employed. The additional signal generator could be used to create more complex patterns on the output frequency $f_{OUT}$.

Having thus described a few particular embodiments of the invention, various alterations, modifications, and improvements will readily occur to those skilled in the art. Such alterations, modifications and improvements as are made obvious by this disclosure are intended to be part of this description though not expressly stated herein, and are intended to be within the spirit and scope of the invention. Accordingly, the foregoing description is by way of example only, and not limiting. The invention is limited only as defined in the following claims and equivalents thereto.

What is claimed is:

1. A frequency divider for generating a reduced frequency signal from a clock signal, said frequency divider comprising:
    a first configurable signal generator having an input for receiving the clock signal, an output, and a configuration port;
    a second configurable signal generator having an input for receiving the clock signal, an output, and a configuration port;
    a data source coupled to the configuration ports of said first and second signal generators making configuration data available to said first and second signal generators, said configuration data based on instructions received at an instruction port of said data source;
    a sequencer generating said instructions coupled between the outputs of said first and second signal generators and the instruction port of said data source, said sequencer generating said instructions based on the outputs of said first and second signal generators and passing said instructions to the instruction port of said data source; and
    combining logic coupled to the outputs of said first and second signal generators producing the reduced frequency signal.

2. The frequency divider of claim 1, wherein said first signal generator is a first configurable counter and said second signal generator is a second configurable counter.

3. The frequency divider of claim 2, wherein said first and second configurable counters each comprise:

a countdown counter having an output and an input coupled to said data source for loading data from said data source after each countdown by said countdown counter; and
    a flip-flop coupled to the output of said countdown counter for producing an intermediate output signal at an output, said flip-flop regulating the duty cycle of said intermediate output signal.

4. The frequency divider of claim 3, wherein said countdown counter of said first configurable counter is rising edge triggered and said countdown counter of said second configurable counter is falling edge triggered.

5. The frequency divider of claim 1, wherein said combining logic is an XOR gate.

6. The frequency divider of claim 1, wherein said data source is a memory device.

7. The frequency divider of claim 6, wherein said memory device is a dual port memory.

8. The frequency divider of claim 1, wherein said data source is combinational logic.

9. The frequency divider of claim 1, wherein said sequencer further bases said instructions on divisor information received at a divisor port of said sequencer.

10. A frequency divider for generating a reduced frequency signal from a clock signal, said frequency divider comprising:
    at least two configurable counters, each of said configurable counters having a configuration port, a clock port for receiving the clock signal, and an output for passing an intermediate output signal;
    a data source coupled to the configuration ports of said at least two configurable counters making configuration data available to said at least two configurable counters, said configuration data based on instruction received at an instruction port of said data source;
    a sequencer generating said instruction coupled between the outputs of said at least two configurable counters and the instruction port of said data source, said sequencer generating said instructions based on the outputs of said at least two configurable counters and passing said instructions to the instruction port of said data source; and
    combining logic coupled to the outputs of said at least two configurable counters to combine said intermediate output signals producing the reduced frequency signal.

11. The frequency divider of claim 10, wherein each of said at least two configurable counters comprises:
    a countdown counter having an output and an input coupled to said data source for loading data from said data source after each countdown by said countdown counter; and
    a flip-flop coupled to the output of said countdown counter for producing said intermediate output signal at an output, said flip-flop regulating the duty cycle of said intermediate output signal.

12. The frequency divider of claim 11, wherein said countdown counter of one of said at least two configurable counters is rising edge triggered and said countdown counter of another of said at least two configurable counters is falling edge triggered.

13. The frequency divider of claim 10, wherein said combining logic is an XOR gate.

14. The frequency divider of claim 10, wherein said data source is a memory device.

15. The frequency divider of claim 10, wherein said data source is combinational logic.

16. The frequency divider of claim 10, wherein said sequencer further bases said instructions on divisor information received at a divisor port of said sequencer.

17. A method for dividing a clock signal to generate a reduced frequency signal, comprising the steps of:

generating a first signal comprising a first counting interval and a second counting interval, said first and second counting intervals being individually configurable and based on a rising edge of the clock signal;

generating a second signal comprising a third counting interval and a fourth counting interval, said third and fourth counting intervals being individually configurable and based on a falling edge of the clock signal; and combining said first and second signals to create the reduced frequency signal, wherein an output level of the reduced frequency signal changes after every counting interval.

18. The method of claim 17, wherein said step of generating said first signal comprises the steps of:

configuring a first counting device with a first integer to generate said first counting interval, said first counting interval having a first logic level; and configuring said first counting device with a second integer to generate said second counting interval, said second counting interval having a second logic level different from said first logic level.

19. The method of claim 18, wherein said step of generating said first signal further comprises:

alternating between configuring said first counting device with said first integer and said second integer.

20. The method of claim 19, wherein said step of generating said second signal comprises the steps of:

configuring a second counting device with a third integer to generate said third counting interval, said third counting interval having a third logic level;

configuring said second counting device with a fourth integer to generate said fourth counting interval, said fourth interval having a fourth logic level different from said third logic level.

21. The method of claim 20, wherein said step of generating said second signal further comprises:

alternating between configuring said second counting device with said third integer and said fourth integer.

22. The method of claim 21, wherein said output level changes whenever there is a transition between said first and second logic levels or a transition between said third and fourth logic levels.

23. A method for dividing a clock signal to generate a reduced frequency signal, comprising the steps of:

generating a plurality of signals, each signal comprising individually configured counting intervals, said counting intervals of at least one of said plurality of signals being based on a rising edge of the clock signal and the counting intervals of at least one of said plurality of signals being based on a falling edge of the clock signal; and combining said plurality of signals to create the reduced frequency signal, wherein an output level of the reduced frequency signal changes after every counting interval.

24. The method of claim 23, wherein said step of generating said plurality of signals comprises the steps of:

configuring a plurality of counting device associated with each of said plurality of signals with data to generate one of said counting intervals for each of said plurality of signals, said one of said counting intervals having a first logic level;

reconfiguring said plurality of counting device with data to generate another of said counting intervals for each of said plurality of signals, said another of said counting intervals having a second logic level different from said first logic level.

25. The method of claim 24, wherein said output level changes whenever there is a transition between said first and second logic levels in any of said plurality of signals.

* * * * *